United States Patent
Kulick et al.

(10) Patent No.: US 9,285,826 B2
(45) Date of Patent: Mar. 15, 2016

(54) DETERMINISTIC CLOCK CROSSING

(75) Inventors: Stanley Steve Kulick, Portland, OR (US); Erin Francom, Fort Collins, CO (US); Jason Bessette, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 237 days.

(21) Appl. No.: 13/995,274

(22) PCT Filed: Dec. 22, 2011

(86) PCT No.: PCT/US2011/067003
§ 371 (c)(1),
(2), (4) Date: Jun. 18, 2013

(87) PCT Pub. No.: WO2013/095557
PCT Pub. Date: Jun. 27, 2013

(65) Prior Publication Data
US 2013/0326205 A1 Dec. 5, 2013

(51) Int. Cl.
*G06F 1/06* (2006.01)
*G06F 1/12* (2006.01)
*G06F 1/24* (2006.01)
*H03L 7/08* (2006.01)
*G11C 7/22* (2006.01)

(52) U.S. Cl.
CPC .. *G06F 1/06* (2013.01); *G06F 1/12* (2013.01); *G06F 1/24* (2013.01); *G11C 7/222* (2013.01); *H03L 7/08* (2013.01)

(58) Field of Classification Search
CPC ............... G06F 1/06; G06F 1/12; G06F 1/24; G11C 7/222; H03L 7/08
See application file for complete search history.

(56) References Cited

U.S. PATENT DOCUMENTS

| | | | |
|---|---|---|---|
| 6,748,039 B1 * | 6/2004 | Bates | 375/354 |
| 6,977,979 B1 * | 12/2005 | Hartwell et al. | 375/354 |
| 7,715,467 B1 * | 5/2010 | Burney | 375/219 |
| 8,737,162 B2 * | 5/2014 | Ware et al. | 365/233.11 |
| 2004/0003163 A1 | 1/2004 | Kleveland et al. | |
| 2006/0067141 A1 | 3/2006 | Perego et al. | |
| 2009/0240969 A1 | 9/2009 | Chiu et al. | |
| 2010/0049887 A1 | 2/2010 | Williams et al. | |

OTHER PUBLICATIONS

International Search Report and Written Opinion for PCT/US2011/067003 mailed Aug. 31, 2012, 10 pages.
International Preliminary Report on Patentability for PCT/US2011/067003 mailed Jul. 3, 2014, 6 pages.

* cited by examiner

*Primary Examiner* — Stefan Stoynov
(74) *Attorney, Agent, or Firm* — Blakely, Sokoloff, Taylor & Zafman LLP

(57) ABSTRACT

Techniques and apparatuses for clock crossing. A reset circuit on a first die generates a forwarded FIFO reset signal synchronous to a reference clock that identifies a single edge. A clock generation circuit on the first die generates the reference clock signal. Control circuitry on the first die generates a forwarded signal, synchronous to the forwarded clock that identifies a forwarded clock edge with fixed timing relationship to the forwarded clock edge a transmit PLL locks to the single reference edge. A phase locked loop (PLL) on a second die is coupled to receive the reference clock signal, the PLL to generate a local clock signal. A circular FIFO with a write pointer advanced by the forwarded clock and a read pointer advanced by the local clock.

15 Claims, 4 Drawing Sheets

DETERMINISTIC CLOCK CROSSING

TECHNICAL FIELD

Embodiments of the invention relate to input/output architectures and interfaces. More particularly, embodiments of the invention relate to high-bandwidth on-package input/output architectures and interfaces.

BACKGROUND

High bandwidth interconnections between chips using conventional input/output (I/O) interfaces require significant power and chip area. Thus, in applications requiring significantly reduced power consumption and/or smaller chip area, these conventional interfaces are not desirable.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Figure 1:
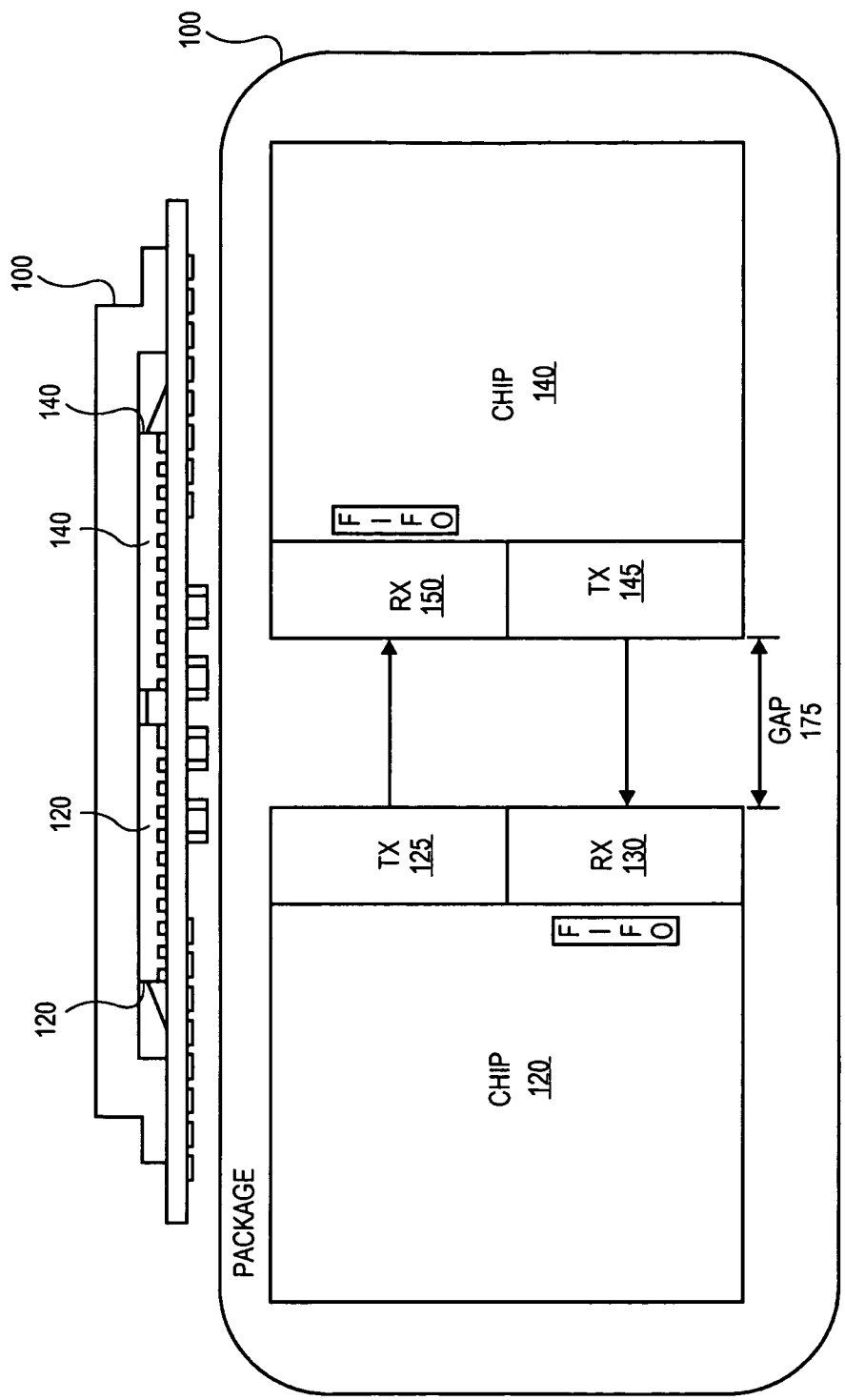
FIG. 1 is a block diagram of one embodiment of a multichip package (MCP) having on-package input/output (OPIO) interfaces between at least two chips.

FIG. 1 is a block diagram of one embodiment of a multichip package (MCP) having on-package input/output (OPIO) interfaces between at least two chips. The example of FIG. 1 illustrates two chips with interfaces; however, any number of chips within a package can be interconnected using the techniques described herein.

Package 100 may be any type of package that may contain multiple integrated circuit chips. In the example of FIG. 1, package 100 contains chip 120 and chip 140. These chips may be, for example, processors, memory chips, graphics processors, etc.

In one embodiment, chip 120 includes OPIO transmitters 125 and OPIO receivers 130. Similarly, chip 140 includes OPIO transmitters 145 and OPIO receivers 150. Transmitters 125 are coupled with receivers 150 and transmitters 145 are coupled with receivers 130.

In one embodiment, gap 175 between chip 120 and chip 140 is relatively small. In one embodiment, gap 175 is less than 20 mm. In one embodiment, gap 175 is less than 10 mm. In one embodiment, gap 175 is approximately 1.5 mm. In other embodiments, gap 175 may be less than 1.5 mm. In general, the smaller gap 175, the greater the bandwidth that may be provided between chips.

In one embodiment, the interfaces between transmitter 125 and receiver 150, and between transmitter 145 and receiver 130 are single-ended, relatively high-speed interfaces. In one embodiment, the interfaces are CMOS interfaces between chip 120 and chip 140. In one embodiment, transmitters 125 and 145 are impedance matched CMOS transmitters and no termination or equalization is provided. In one embodiment, transmitters 125 and 145 are impedance matched CMOS transmitters and very weak termination and no equalization is provided.

In one embodiment, a forwarded clock signal is transmitted for a cluster of signals. In one embodiment, length-matched routing is provided between the transmitters and the receivers. In one embodiment, minimal electrostatic discharge (ESD) protection (as little as 70 Volts) is provided for the interfaces between chips 120 and 140.

In one embodiment, use of a CMOS transmitter and receiver with no or weak receiver termination and no equalization can reduce I/O power. Simplified clocking with forwarded clock per cluster of signals and no per pin de-skew can be achieved due to careful length matched routing reduces clock power. Thus, the architectures described herein provide high bandwidth between chips at very low power, area and latency.

The architectures described herein can also be extended to close discrete packages with full ESD protection for small form factor mobile applications at lower data rates. Multilevel (e.g., M-PAM) signaling can be used at higher data rates to keep the clock frequency down.

When passing clock signals from one chip to another, buffers (often First-In/First-Out, FIFO) are used to absorb clock skew across clock domains. If the buffers are reset asynchronously, or the valid is passed asynchronously through the FIFO, the delay through the buffer is increased, (i.e., a larger buffer) to compensate for the unknown clock skew at reset time.

Inside components, for example, the pointer logic on both sides of the buffer, can be reset on a high speed clock edge that is nominally aligned with the common reference clock by a phase locked loop (PLL). To do this across components, the forwarded clock edge that has a fixed timing relationship to the edge compared to the reference clock input to the PLL corresponds to the PLL signal must be identified.

In one embodiment, a sideband interface running on the reference clock signal is used to establish a one reference clock signal wide window in which buffer resets take place. In an alternate embodiment, the window is wider and multiple pulses are sent from the transmitter. The earlier pulses may be utilized to reset clock dividers required to perform the ultimate FIFO resets. What is required is to identify one reference edge on both sides.

The PLL for the read side provides an internal qualifier to identify the clock signal edge on the read clock. In one embodiment, a pulse is provided over the interface link to identify the edge of the write clock to use. In one embodiment, this is provided by the PLL on the transmit side and driven across the interface (e.g., the interface of FIG. 1).

Figure 2:
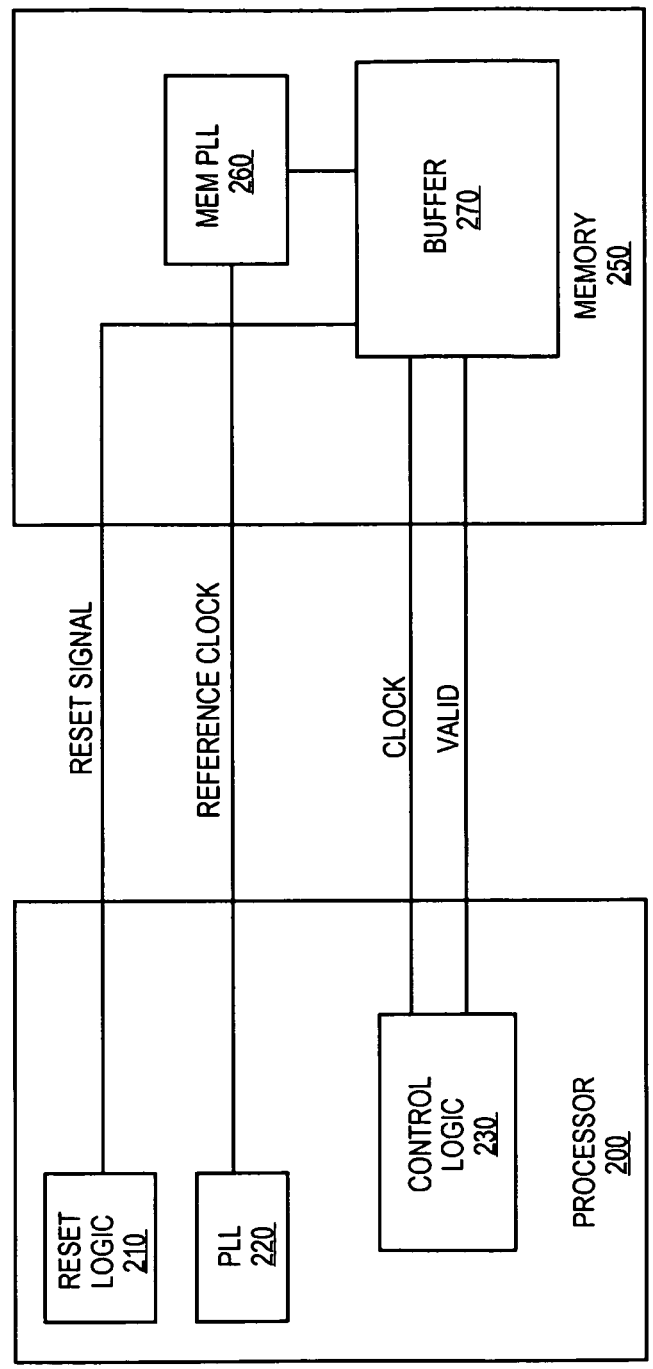
FIG. 2 is a circuit diagram of one embodiment of an architecture to provide a deterministic forwarded clock signal.

FIG. 2 is a circuit diagram of one embodiment of an architecture to provide a deterministic forwarded clock signal. The circuits of FIG. 2 may be used to provide a deterministic forwarded clock signal between chips with PLL drift that is more than one clock signal and provide a nominal alignment for the start of read and write pointers for the receive buffer. The result may be a smaller buffer with lower latency than would otherwise be possible.

The example of FIG. 2, processor 200 is a master device and memory 250 is a slave device connected using the interface of FIG. 1. Any type of master and slave devices connected using the interface of FIG. 1 may be supported. Some of the lines of the interface of FIG. 1 are used to carry the signals illustrated in FIG. 2. In one embodiment, reset logic 210 may generate a reset signal that is used to trigger a reset in buffer 270 and/or other components of processor 200 and/or memory 250. In one embodiment, the reset signal is carried via a virtual wire.

Phase locked loop (PLL) 220 generates a reference clock signal that is transmitted to memory PLL 260 over the interface of FIG. 1. Control logic 230 generates a forwarded clock signal that is used to by buffer 270 to read and write data received from processor 200. In one embodiment, a valid signal is also transmitted from processor 200 to memory 250 to indicate when the forwarded clock signal is valid.

By using the circuitry and clock signals illustrated in FIG. 2, the forwarded clock signal is a deterministic signal that can be used to provide alignment for the read and write pointers for buffer 270. By having a deterministic clock signal, the overall size of buffer 270 may be reduced as compared to use of a non-deterministic signal, which may reduce the cost and complexity of buffer 270 as well as the latency corresponding to use of buffer 270.

Figure 3:
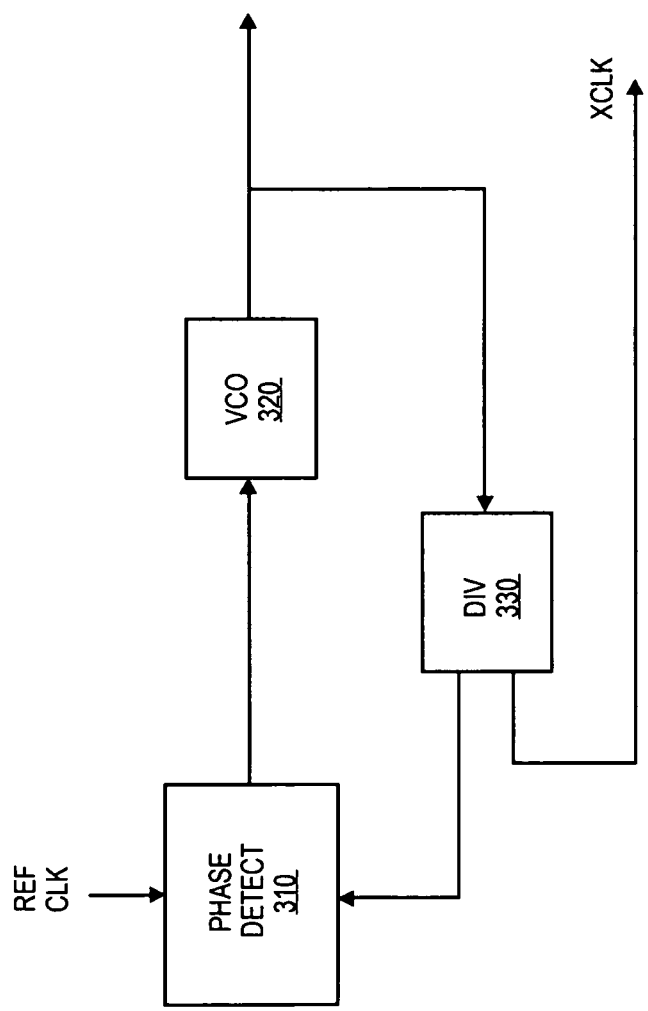
FIG. 3 is a circuit diagram of one embodiment of an architecture to provide a signal for use with a receive-side buffer.

FIG. 3 is a circuit diagram of one embodiment of an architecture to provide a clock signal for use with a receive-side buffer. The circuit of FIG. 3 may be used to generate a clock signal that indicates the edge of a PLL output signal that is nominally aligned (or compared) to the reference clock rising edge to be used to reset the receive side buffer read and write pointers.

Phase detector 310 receives the reference clock signal and a feedback clock signal and operates to generate an output based on the difference in phase between the two signals. The output from phase detector 310 is provided to voltage controlled oscillator 320 that generates an output clock signal based on the phase difference as determined by phase detector 310.

The output signal from VCO 320 can be used as a clock signal by one or more components on the die. In one embodiment, the output from VCO 320 is provided to divider 330 that divides the clock signal down. In one embodiment, the output of divider 330 is use as the XREF, or reference clock signal that may be used by a receive side buffer for controlling read and write pointers.

Figure 4:
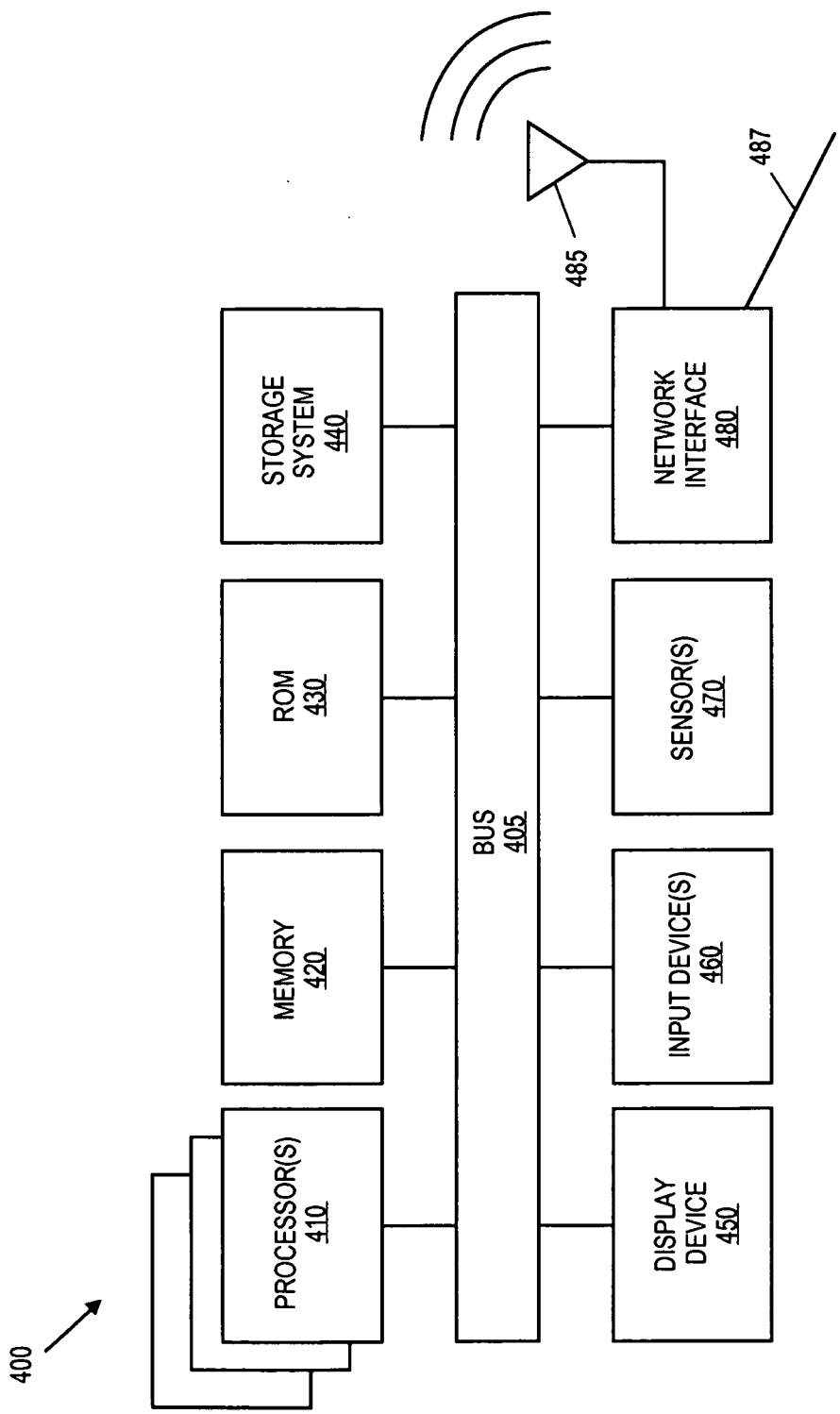
FIG. 4 is a block diagram of one embodiment of an electronic system.

FIG. 4 is a block diagram of one embodiment of an electronic system. The electronic system illustrated in FIG. 4 is intended to represent a range of electronic systems (either wired or wireless) including, for example, a tablet device, a smartphone, a desktop computer system, a laptop computer system, a server etc. Alternative electronic systems may include more, fewer and/or different components.

One or more of the components illustrated in FIG. 4 may be interconnected utilizing the OPIO architectures described herein. For example, multiple processor chips may be interconnected, or a processor and a cache memory or dynamic random access memory, etc.

Electronic system 400 includes bus 405 or other communication device to communicate information, and processor(s) 410 coupled to bus 405 that may process information. Electronic system 400 may include multiple processors and/or co-processors. Electronic system 400 further may include random access memory (RAM) or other dynamic storage device 420 (referred to as memory), coupled to bus 405 and may store information and instructions that may be executed by processor 410. Memory 420 may also be used to store temporary variables or other intermediate information during execution of instructions by processor(s) 410.

Electronic system 400 may also include read only memory (ROM) and/or other static storage device 430 coupled to bus 405 that may store static information and instructions for processor 410. Data storage device 440 may be coupled to bus 405 to store information and instructions. Data storage device 440 such as a magnetic disk or optical disc and corresponding drive may be coupled to electronic system 400.

Electronic system 400 may also be coupled via bus 405 to display device 450, which can be any type of display device, to display information to a user, for example, a touch screen. Input device 460 may be any type of interface and/or device to allow a user to provide input to electronic system 400. Input device may include hard buttons and/or soft buttons, voice or speaker input, to communicate information and command selections to processor(s) 410.

Electronic system 400 may further include sensors 470 that may be used to support functionality provided by Electronic system 400. Sensors 470 may include, for example, a gyroscope, a proximity sensor, a light sensor, etc. Any number of sensors and sensor types may be supported.

Electronic system 400 further may include network interface(s) 480 to provide access to a network, such as a local area network. Network interface(s) 480 may include, for example, a wireless network interface having antenna 485, which may represent one or more antenna(e). Network interface(s) 480 may also include, for example, a wired network interface to communicate with remote devices via network cable 487, which may be, for example, an Ethernet cable, a coaxial cable, a fiber optic cable, a serial cable, or a parallel cable.

In one embodiment, network interface(s) 480 may provide access to a local area network, for example, by conforming to IEEE 802.11b and/or IEEE 802.11g and/or IEEE 802.11n standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
a reset circuit on a first die to generate a forwarded FIFO reset signal;
a clock generation circuit on the first die to generate a reference clock signal;
control circuitry on the first die to generate a forwarded signal which identifies a window based on the reference clock signal;
a phase locked loop (PLL) on a second die coupled to receive the reference clock signal; and
a FIFO on the second die to be reset within the window identified by the forwarded signal.

2. The apparatus of claim 1, wherein the first die comprises at least a processor core, the apparatus further comprising a touch screen interface coupled with the processor core.

3. The apparatus of claim 2 wherein the second die comprises a memory.

4. The apparatus of claim 1 wherein the first die and the second die are disposed within a single integrated circuit package.

5. A tablet computing device comprising:
a touch screen interface;
a reset circuit on a first die to generate a forwarded FIFO reset signal;
a clock generation circuit on the first die to generate a reference clock signal;
control circuitry on the first die to generate a forwarded signal which identifies a window based on the reference clock signal;
a phase locked loop (PLL) on a second die coupled to receive the reference clock signal; and
a FIFO on the second die to be reset within the window identified by the forwarded signal.

6. The tablet of claim 5, wherein the first die comprises at least a processor core.

7. The tablet of claim 6 wherein the second die comprises a memory.

8. The tablet of claim 5 wherein the first die and the second die are disposed within a single integrated circuit package.

9. A system comprising:
an onmidirectinal antenna;
a reset circuit on a first die to generate a forwarded FIFO reset signal;
a clock generation circuit on the first die to generate a reference clock signal;
control circuitry on the first die to generate a forwarded signal which identifies a window based on the reference clock signal;
a phase locked loop (PLL) on a second die coupled to receive the reference clock signal; and
a FIFO on the second die to be reset within the window identified by the forwarded signal.

10. The system of claim 9, wherein the first die comprises at least a processor core, the apparatus further comprising a touch screen interface coupled with the processor core.

11. The system of claim 10 wherein the second die comprises a memory.

12. The system of claim 9 wherein the first die and the second die are disposed within a single integrated circuit package.

13. An apparatus, comprising:
a first semiconductor chip, comprising:
a) reset signal generation logic circuitry to generate a reset signal, said reset signal to be forwarded to a second semiconductor chip to reset a FIFO of the second semiconductor chip that is coupled to the first semiconductor chip;
b) a first phase lock loop circuit to generate a reference clock that is to be received by a second phase lock loop circuit of the second semiconductor chip, the second phase lock loop circuit to clock the FIFO of the second semiconductor chip;
c) sideband signal circuitry to generate sideband information to be received by the second semiconductor chip to establish a window based on the reference clock at which a reset of the FIFO buffer is to take place.

14. The apparatus of claim 13 wherein the first semiconductor chip is to be placed 1.5 mm or less from the second semiconductor chip.

15. The apparatus of claim 14 wherein the first semiconductor chip is a processor and the second semiconductor chip is a memory device.

* * * * *